(12) United States Patent
Ji et al.

(10) Patent No.: US 12,154,839 B2
(45) Date of Patent: Nov. 26, 2024

(54) GRAPHENE-COATED HEAT SPREADER FOR INTEGRATED CIRCUIT DEVICE ASSEMBLIES

(71) Applicant: ADVANCED MICRO DEVICES, INC., Santa Clara, CA (US)

(72) Inventors: Xiaoyang Ji, Suzhou (CN); Li An, Suzhou (CN); Soo Pin Chow, Singapore (SG)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 52 days.

(21) Appl. No.: 17/698,209

(22) Filed: Mar. 18, 2022

(65) Prior Publication Data

US 2023/0197555 A1  Jun. 22, 2023

(30) Foreign Application Priority Data

Dec. 17, 2021  (CN) .......................... 202111551218.2

(51) Int. Cl.
*H01L 23/373* (2006.01)
*H01L 23/00* (2006.01)
*H01L 23/367* (2006.01)
*H01L 23/538* (2006.01)
*H01L 23/552* (2006.01)

(52) U.S. Cl.
CPC .......... *H01L 23/3735* (2013.01); *H01L 24/83* (2013.01); *H01L 23/3675* (2013.01); *H01L 23/5389* (2013.01); *H01L 23/552* (2013.01); *H01L 24/32* (2013.01); *H01L 2224/32245* (2013.01); *H01L 2224/83395* (2013.01); *H01L 2224/83447* (2013.01); *H01L 2224/83455* (2013.01); *H01L 2224/83493* (2013.01)

(58) Field of Classification Search
CPC . H01L 23/3735; H01L 24/83; H01L 23/3675; H01L 24/32; H01L 2224/32245; H01L 2224/83395; H01L 2224/83447; H01L 2224/83455; H01L 2224/83493; H01L 23/3736; H01L 23/42; H01L 23/373; H01L 21/50; H01L 23/367; H01L 23/5389; H01L 23/552
See application file for complete search history.

(56) References Cited

U.S. PATENT DOCUMENTS

| | | | |
|---|---|---|---|
| 5,406,025 A * | 4/1995 | Carlstedt | H01L 23/057 174/541 |
| 2014/0361428 A1* | 12/2014 | Park | H01L 23/552 257/737 |
| 2020/0185294 A1* | 6/2020 | Srinivasa Setty | H01L 23/298 |

* cited by examiner

*Primary Examiner* — Patricia D Valenzuela

(57) ABSTRACT

An integrated circuit device assembly including a graphene-coated heat spreader, including: a substrate; a die coupled to the substrate; and a heat spreader thermally coupled to the die, the heat spreader comprising: a body of thermally conductive metal defining a cavity at least partially surrounding the die; and a graphene layer contacting a surface of the body.

24 Claims, 7 Drawing Sheets

GRAPHENE-COATED HEAT SPREADER FOR INTEGRATED CIRCUIT DEVICE ASSEMBLIES

BACKGROUND

The use of dies in computing devices, such as central processing units (CPUs) or other processors), cause the dies to generate heat that must be properly cooled to ensure stable performance. To do so, various cooling components are used, such as heat sinks, fans, liquid cooling systems, and the like. A heat spreader thermally coupled to a die allows for heat to be transferred from the die and distributed throughout the heat spreader.

DETAILED DESCRIPTION

Figure 1A:
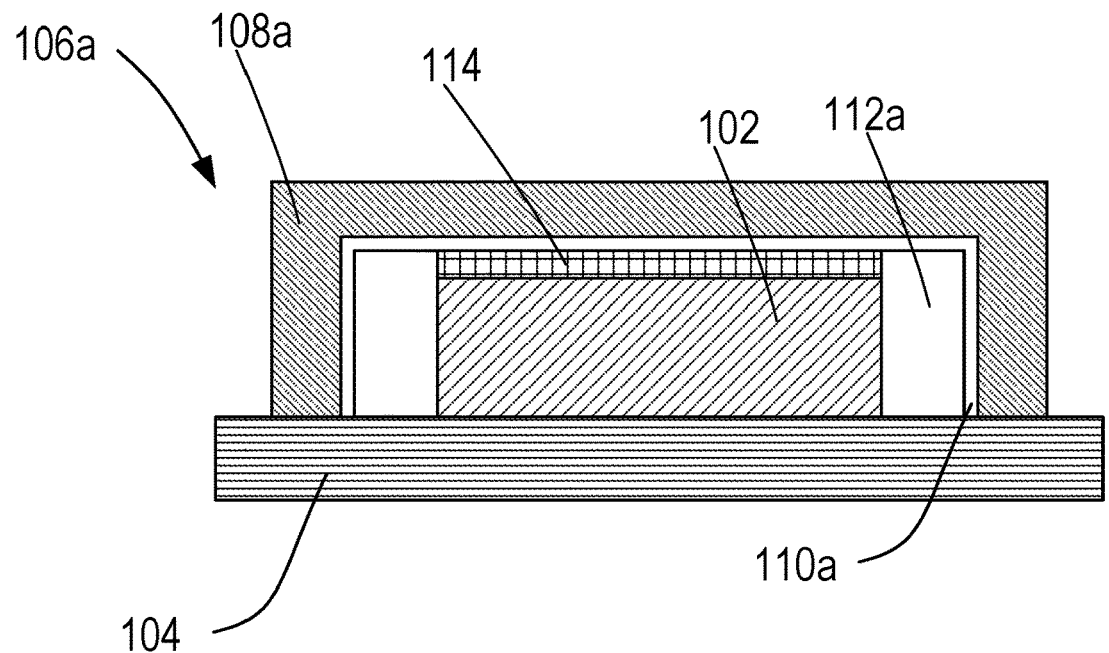
FIG. 1A is a diagram of an example integrated circuit device assembly including a graphene-coated heat spreader according to some implementations.

The use of dies in computing devices, such as central processing units (CPUs) or other processors), cause the dies to generate heat that must be properly cooled to ensure stable performance. To do so, various cooling components are used, such as heat sinks, fans, liquid cooling systems, and the like. A heat spreader thermally coupled to a die allows for heat to be transferred from the die and distributed throughout the heat spreader. The heat now in the heat spreader is then spread to a cooling element, such as a liquid cooling system or fan, or is dissipated into the ambient environment.

A heat spreader will generally have a larger surface area than the die to which it is thermally coupled. By distributing heat throughout the larger surface area of the heat spreader, cooling elements or the ambient environment are able to receive heat via a larger surface area compared to cooling the die directly. This improves the overall cooling efficiency for the die. Accordingly, improved thermal conductivity and distribution within the heat spreader will also increase the overall cooling efficiency for the die, allowing for dies to operate at higher performance levels and generate more heat while maintaining acceptable temperatures of the die.

To that end, the present specification sets forth various implementations of a graphene-coated heat spreader for integrated circuit device assemblies. In an implementation, an integrated circuit device assembly including a graphene-coated heat spreader includes: a substrate; a die coupled to the substrate; and a heat spreader thermally coupled to the die. The heat spreader includes a body of thermally conductive material (such as a metal or alloy) defining a cavity at least partially surrounding the die and a graphene layer contacting a surface of the body.

In some implementations, the die is thermally coupled to the heat spreader via a portion of thermal interface material. In some implementations, the cavity is defined by an inner surface of the body. In some implementations, the graphene layer contacts the inner surface of the heat spreader. In some implementations, the graphene layer contacts an outer surface of the body opposite the cavity. In some implementations, the graphene layer includes a graphene film adhered to the surface. In some implementations, the graphene layer includes chemical vapor deposition (CVD) graphene. In some implementations, the integrated circuit device assembly includes a cooling element thermally coupled to the heat spreader.

The present specification also describes a method that includes coupling a die to a substrate and thermally coupling the die to a heat spreader. Such a heat spreader includes: a body of thermally conductive material defining a cavity receiving the die and a graphene layer contacting a surface of the body.

In some implementations, the graphene layer includes a graphene film adhered to the surface. In some implementations, the graphene layer comprises a chemical vapor deposition (CVD) of graphene. In some implementations, the heat spreader is thermally coupled to the die by a thermal interface material. In some implementations, the graphene layer is applied to an inner surface of the body defining the cavity. In some implementations, the graphene layer is applied to an outer surface of the body opposite the cavity. In some implementations, the method further includes thermally coupling a cooling element to the heat spreader.

The present specification also describes various implementations for a heat spreader for integrated circuit dies including: a body of thermally conductive material defining a cavity receiving a die; and a graphene layer applied to a surface of the body.

In some implementations, the graphene layer is applied to an inner surface of the body defining the cavity. In some implementations, the graphene layer is applied to an outer surface of the body opposite the cavity. In some implementations, the graphene layer includes a graphene film adhered to the surface. In some implementations, the graphene layer includes chemical vapor deposition (CVD) graphene.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features formed between the first and second features, such that the first and second features are in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

Figure 5:
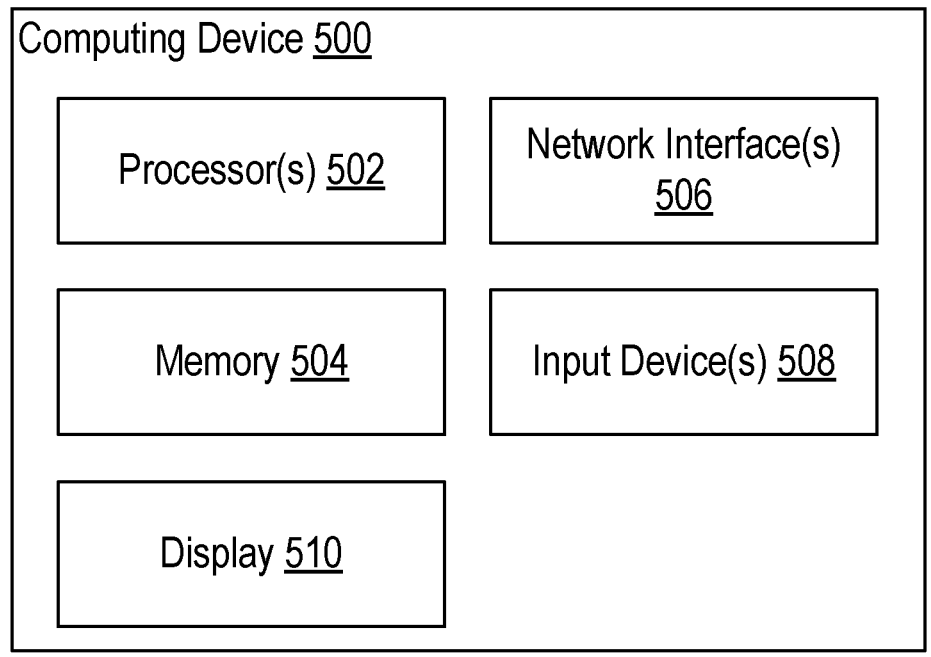
FIG. 5 is a block diagram of an example computing device having an integrated circuit device assembly including a graphene-coated heat spreader according to some implementations.

FIG. 1A is a cross-sectional diagram of an example integrated circuit device assembly including a graphene-coated heat spreader according to some implementations of the present disclosure. The example processor integrated circuit device assembly can be implemented in a variety of computing devices, including mobile devices, personal computers, peripheral hardware components, gaming devices, set-top boxes, smart phones and the like (as shown in FIG. 5). The example integrated circuit device assembly of FIG. 1A includes a die 102. The die 102 is a block of semiconducting material such as silicon onto which a functional integrated circuit is fabricated. As an example, the die 102 includes a processor such as a Central Processing Unit (GPU), a Graphics Processing Unit (GPU), or other processor as can be appreciated.

As an example, the die 102 includes a processor 502 of a computing device 500 as shown in FIG. 5. The computing device 500 is implemented, for example, as a desktop computer, a laptop computer, a server, a game console, a smart phone, a tablet, and the like. In addition to one or more processors 502, the computing device 500 includes memory 504. The memory 504 includes Random Access Memory (RAM) or other volatile memory. The memory 504 also includes non-volatile memory such as disk storage, solid state storage, and the like.

In some implementations, the computing device 500 also includes one or more network interfaces 506. In some implementations, the network interfaces 506 include a wired network interface 506 such as Ethernet or another wired network connection as can be appreciated. In some implementations, the network interfaces 506 include wireless network interfaces 506 such as WiFi, Bluetooth, cellular, or other wireless network interfaces 506 as can be appreciated. In some implementations, the computing device 500 includes one or more input devices 508 that accept user input. Such input devices 508 include, for example, keyboards, touchpads, touch screen interfaces, and the like. One skilled in the art will appreciate that, in some implementations, the input devices 508 include peripheral devices such as external keyboards, mouses, and the like.

In some implementations, the computing device 500 includes a display 510. In some implementations, the display 510 includes an external display 510 connected via a video or display port. In some implementations, the display 510 includes a display 510 housed within a housing of the computing device 500. As an example, the display 510 includes a screen of a tablet, laptop, smartphone, or other mobile device. In implementations where the display 510 includes a touch screen, the display 510 also serves as an input device 508.

One skilled in the art will appreciate that, where the computing device 500 includes a mobile device such as a laptop, smartphone, tablet, and the like, the graphene-coated heat spreaders described herein allow for the computing device 500 to operate at temperatures within an acceptable window while enabling greater performance and/or improved perceived operating characteristics through the reduction of hot spots on the device through the lowering of localized temperatures which may be detected by a user (e.g., the lower of localized skin temperatures).

The die 102 is coupled to a substrate 104. The substrate 104 is a portion of material that mechanically supports coupled components such as the die 102. In some implementations, the substrate 104 also electrically couples various components mounted to the substrate 104 via conductive traces, tracks, pads, and the like. As an example, in some implementations, the substrate 104 includes a printed circuit board (PCB) in others substrate 104 may be another semiconductor device like die 102 (which may include active components therein). In some implementations, the die 102 is coupled to the substrate 104 via a socket (not shown), whereby the die 102 is soldered to or otherwise mounted in the socket. In other implementations, the die 102 is directly coupled to the substrate 104 via a direct solder connection or other connection as can be appreciated. In some implementations, the die 102 is coupled to the substrate 104 using a land grid array (LGA), pin grid array (PGA), or other packaging technology as can be appreciated.

The example integrated circuit device assembly of FIG. 1A also includes a heat spreader 106a. The heat spreader 106a of FIG. 1A is composed of a body 108a and a graphene layer 110a contacting an inner surface of the body 108a. The body 108a is composed of a thermally conductive material such as a metal like copper, nickel, alloys or combinations thereof, or other thermally conductive materials as can be appreciated. The body 108a defines a cavity 112a receiving the die 102. In some implementations, the body 108a defines a cavity that at least partially surrounds the die 102. For example, in some implementations, the body 108a and the substrate 104 (or a socket, where present) house the die 102.

The graphene layer 110a is a portion of graphene applied throughout the inner surface of the body 108a (e.g., the inner surface of the body 108a that defines the cavity 112a). In some implementations, the graphene layer 110a is a chemical vapor deposition (CVD) of graphene. In some implementations, the graphene layer 110a is a film or other layer of graphene as can be appreciated that is formed separate from the body 108a and then adhered or otherwise affixed to the inner surface of the body 108a.

The heat spreader 106a is thermally coupled to the die 102 via a portion of thermal interface material 114. The thermal interface material 114 is a thermally conductive material that enhances thermally coupling between two components, the graphene layer 110a of the body 108a and the die 102 in this implementation. For example, the thermal interface material 114 may include a thermal paste, a thermally conductive adhesive, a thermal pad, or other thermal interface material 114 as can be appreciated.

In some implementations, the heat spreader 106a is physically coupled to or interlocked with another component such as the substrate 104, a socket, or mechanical components attached to the substrate. For example, the heat spreader 106a is held in a fixed position using clips, screws, clamps, and the like, thereby providing a secure connection and thermal coupling to the die 102.

The graphene layer 110a has a higher thermal conductivity than the conductive metal of the body 108a in the X/Y directions of the graphene layer 110a. It is understood that, in this context, the X/Y directions of the graphene layer 110a refer to heat distribution throughout the graphene layer 110a, in contrast to the Z-axis directions that would refer to heat transfer in or out of the graphene layer 110a (e.g., between the graphene layer 110a and the body 108a or the cavity 112a). Accordingly, the graphene layer 110a receives heat from the die 102 that is then distributed throughout the graphene layer 110a. The distributed heat then transfers (e.g., in the Z direction) from the graphene layer 110a to the body 108a. The heat in the body 108a is then transferred into the ambient environment around the body 108a, into a cooling element as to be described in further detail below, or otherwise dissipated.

Figure 1B:
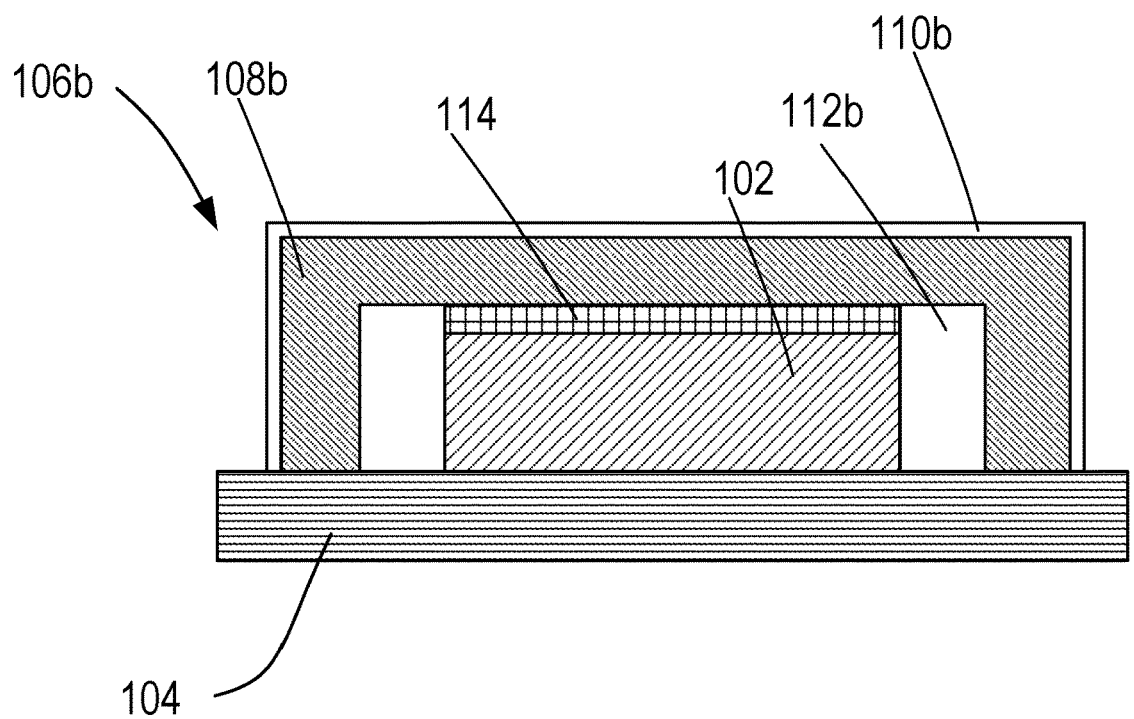
FIG. 1B is a diagram of an example integrated circuit device assembly including a graphene-coated heat spreader according to some implementations.

FIG. 1B is a cross-sectional diagram of an example integrated circuit device assembly including a graphene-coated heat spreader according to some implementations of the present disclosure. The integrated circuit device assembly of FIG. 1B is similar to that of FIG. 1A in that the integrated circuit device assembly of FIG. 1B includes a die 102 coupled to a substrate 104. A heat spreader 106b is thermally coupled to the die 102 via a portion of thermal interface material 114.

In contrast to the heat spreader 106a, the heat spreader of 106b includes a graphene layer 110b applied to an outer surface of a body 108b of thermally conductive metal. In other words, the graphene layer 110b is applied to a surface opposite a cavity 112b receiving the die 102. In some implementations, the graphene layer 110b is a chemical vapor deposition (CVD) of graphene. In some implementations, the graphene layer 110b is a film or other layer of graphene as can be appreciated that is formed separate from the body 108b and then adhered or otherwise affixed to the inner surface of the body 108b.

The graphene layer 110b has a higher thermal emission (e.g., in the Z direction) than the body 108b. Thus, the graphene layer 110b provides enhanced thermal emission and dissipation compared to a body 108b without the graphene layer 110b. Additionally, the graphene layer 110b provides for enhanced infrared (IR) thermal radiation compared to the body 108b. In some implementations, the graphene layer 110b is coupled to a cooling element or other component, described in further detail below, to facilitate thermal conduction and dissipation.

Through the use of graphene layers 110a/b, the heat spreaders 106a/b provide enhanced thermal dissipation and emission of heat generated by the dies 102, eliminating the need for more complicated or expensive heat spreading solutions such as vapor chambers, heat spreaders, and the like.

FIGS. 2A-2F show example manufacturing processes for integrated circuit device assemblies including a graphene-coated heat spreader, such as those shown in FIGS. 1A and 1B, according to some implementations of the present disclosure. Beginning at FIG. 2A, a die 102 is coupled to a substrate 104. The die 102 is a block of semiconducting material such as silicon onto which a functional integrated circuit is fabricated. As an example, the die 102 includes a processor such as a Central Processing Unit (GPU), a Graphics Processing Unit (GPU), or other processor as can be appreciated. The substrate 104 is a portion of material that mechanically supports coupled components such as the die 102. In some implementations, the substrate 104 also electrically couples various components mounted to the substrate 104 via conductive traces, tracks, pads, and the like. As an example, in some implementations, the substrate 104 includes a printed circuit board (PCB). In some implementations, the die 102 is coupled to the substrate 104 via a socket (not shown), whereby the die 102 is soldered to or otherwise mounted in the socket. In other implementations, the die 102 is directly coupled to the substrate 104 via a direct solder connection or other connection as can be appreciated. In some implementations, the die 102 is coupled to the substrate 104 using a land grid array (LGA), pin grid array (PGA), or other packaging technology as can be appreciated.

Figure 2A:
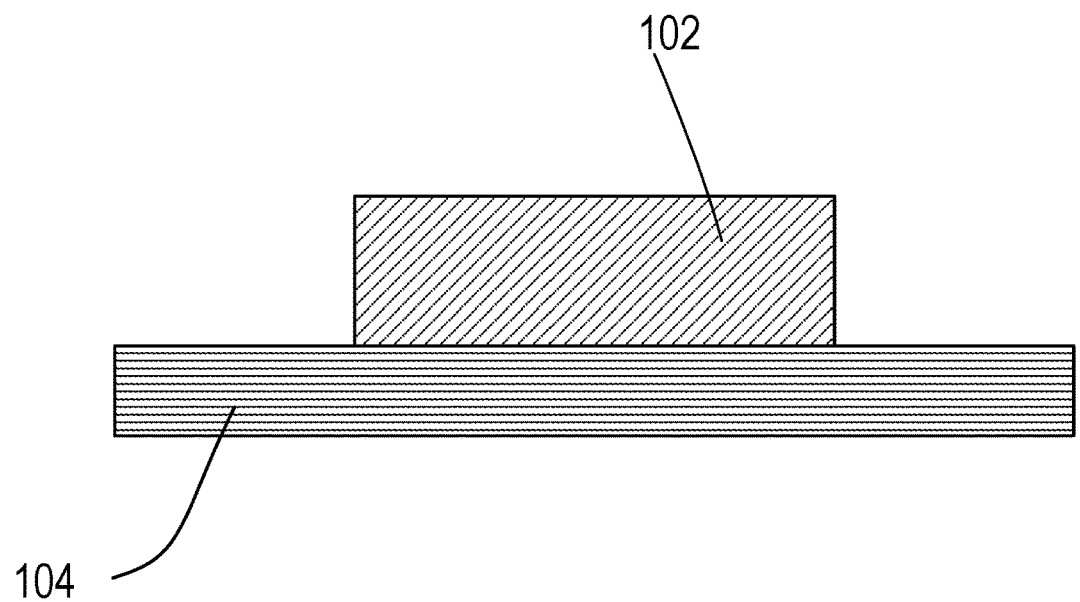
FIG. 2A is part of a process flow for manufacturing an integrated circuit device assembly including a graphene-coated heat spreader according to some implementations.
Figure 2B:
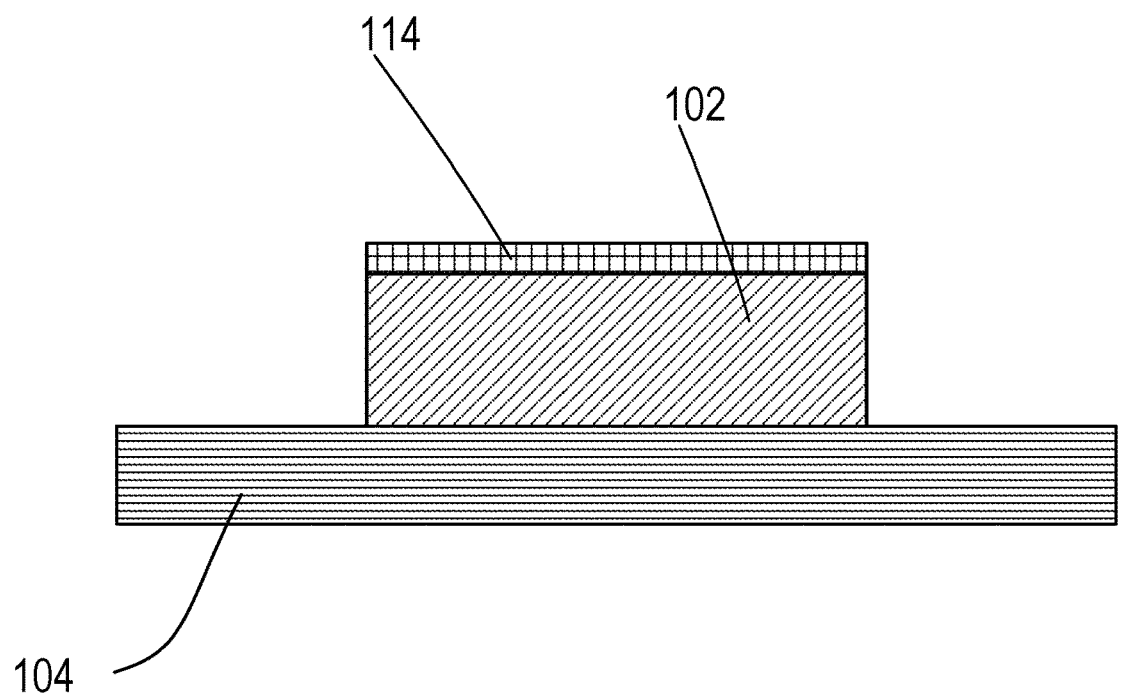
FIG. 2B is part of a process flow for manufacturing an integrated circuit device assembly including a graphene-coated heat spreader according to some implementations.

At FIG. 2B, a portion of thermal interface material 114 is applied to the die 102. The thermal interface material 114 is a thermally conductive material that fills air gaps between two components and facilitates heat transfer between the two components. For example, the thermal interface material 114 includes a thermal paste, a thermally conductive adhesive, a thermal pad, or other thermal interface material 114 as can be appreciated.

Figure 2C:
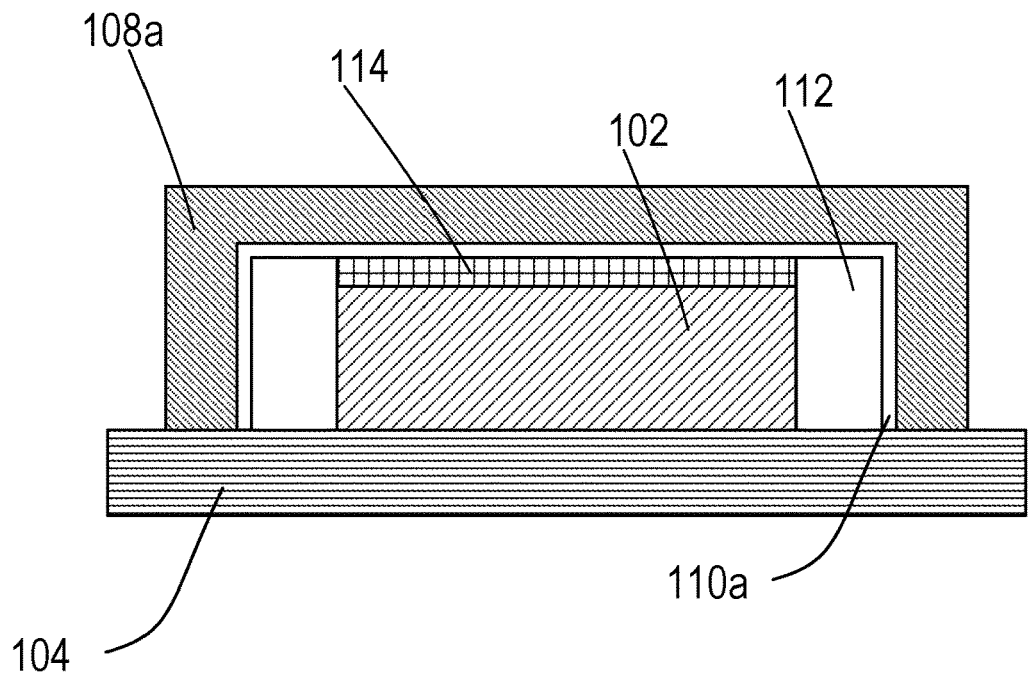
FIG. 2C is part of a process flow for manufacturing an integrated circuit device assembly including a graphene-coated heat spreader according to some implementations.

Moving on to FIG. 2C, in some implementations, a heat spreader (e.g., a heat spreader 106a of FIG. 1A) is thermally coupled to the die 102 via the thermal interface material 114. Here, the heat spreader includes a body 108a of thermally conductive metal and a graphene layer 110a applied to an inner surface of the body 108a defining a cavity 112 receiving the die 102. The thermally conductive metal of the body 108a includes copper, nickel, or another thermally conductive metal as can be appreciated. In some implementations, the graphene layer 110a includes a chemical vapor deposition of graphene. In some implementations, the graphene layer 110a includes a film or other portion of graphene formed separate from the body 108a and then adhered to the inner surface of the body 108a.

Figure 2D:
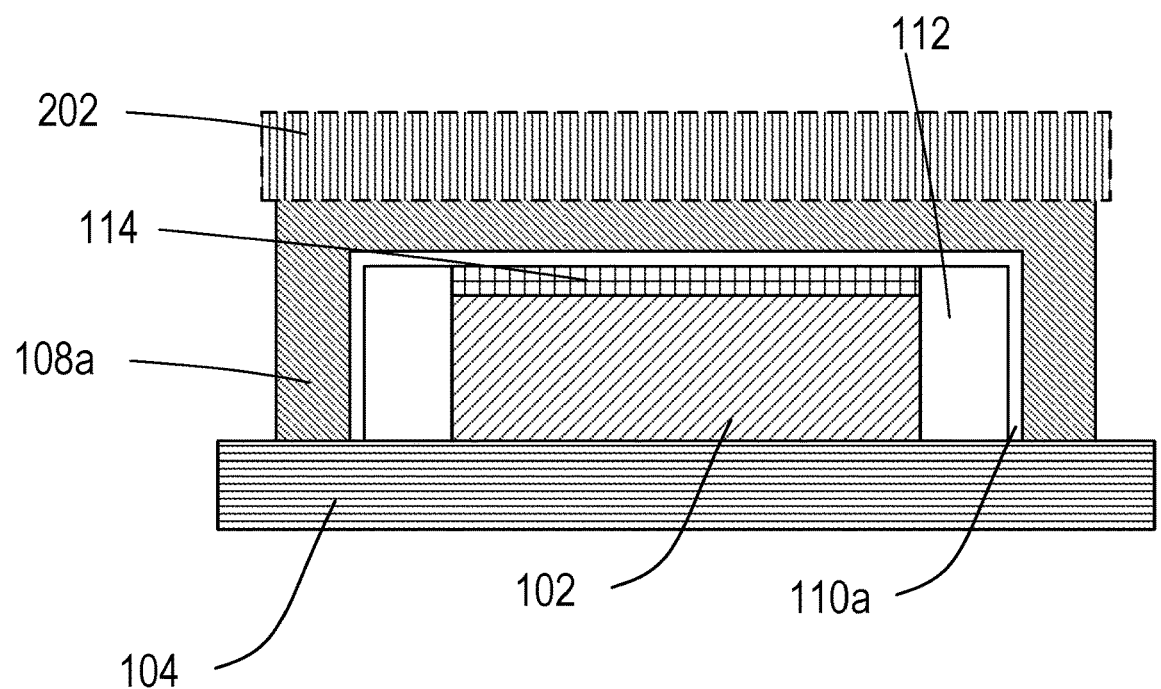
FIG. 2D is part of a process flow for manufacturing an integrated circuit device assembly including a graphene-coated heat spreader according to some implementations.

After coupling the heat spreader to the die 102, at FIG. 2D, in some implementations a cooling element 202 is optionally thermally coupled to the body 108a of the heat spreader. The cooling element 202 is a device or component that receives and removes heat generated by the die 102. For example, the cooling element 202 includes a fan, a heat sink, thermally conductive fins, a portion of a liquid cooling system transferring heat from the body 108a into the liquid cooling system, or another cooling element 202 as can be appreciated.

Figure 2E:
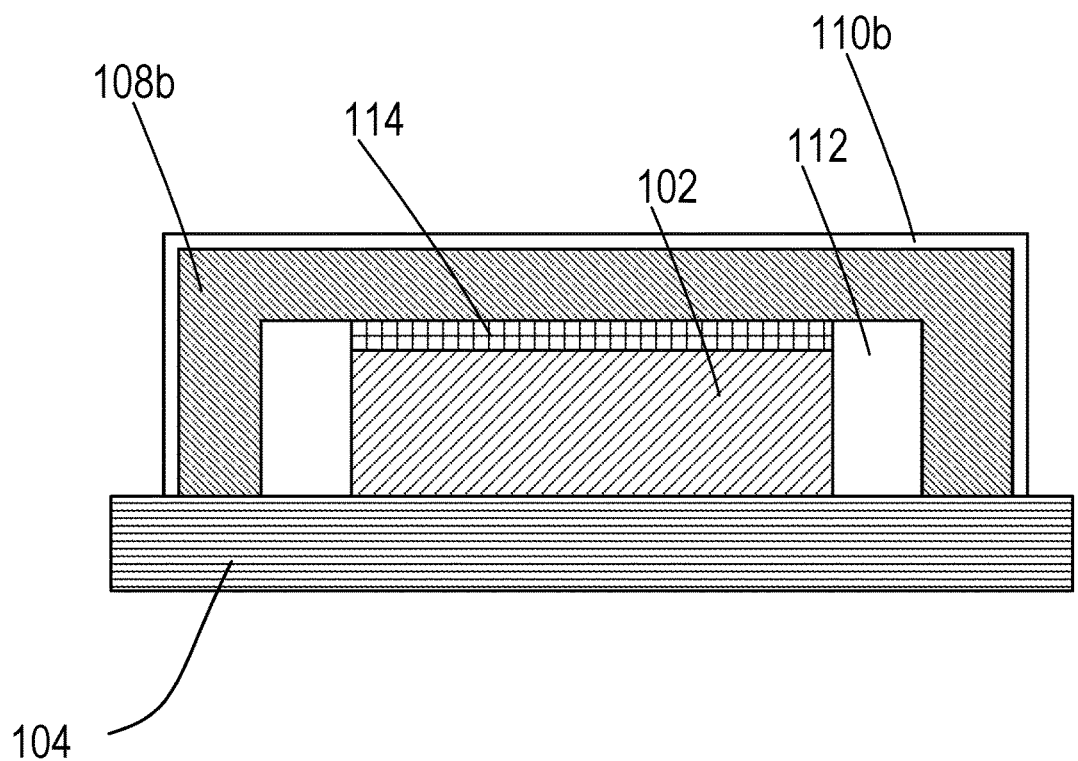
FIG. 2E is part of a process flow for manufacturing an integrated circuit device assembly including a graphene-coated heat spreader according to some implementations.
Figure 2F:
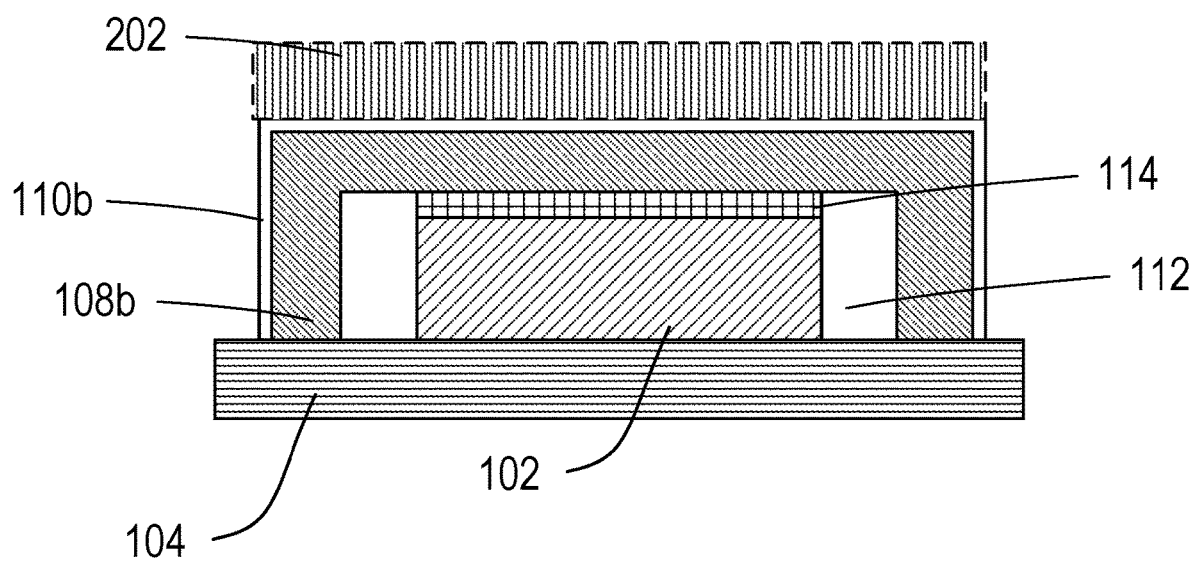
FIG. 2F is part of a process flow for manufacturing an integrated circuit device assembly including a graphene-coated heat spreader according to some implementations.

In some implementations, after the steps shown in FIG. 2B, instead of proceeding to FIGS. 2C and 2D, a heat spreader (e.g., a heat spreader 106b of FIG. 2B) is thermally coupled to the die 102 via the thermal interface material 114 as shown in FIG. 2E. Here, the heat spreader includes a body 108b of thermally conductive metal and a graphene layer 110b applied to an out surface of the body 108b opposite the cavity 112 receiving the die 102. Then, in some implementations as shown in FIG. 2F, the optional cooling element is thermally coupled to the graphene layer 110b of the heat spreader.

Figure 3:
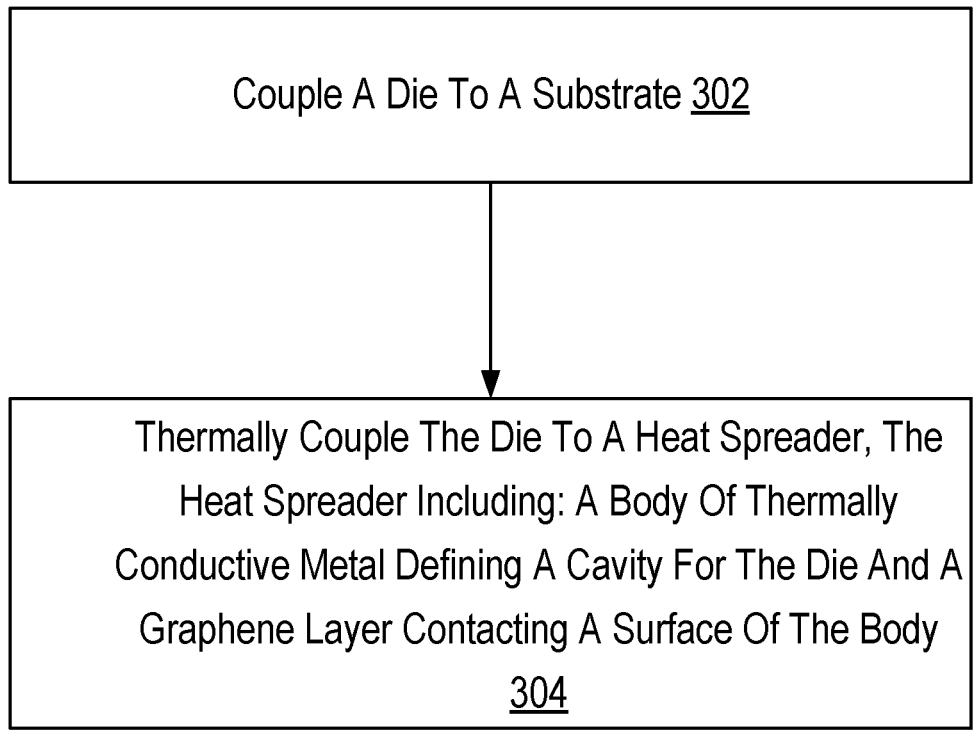
FIG. 3 is a flowchart of an example method for manufacturing an integrated circuit device assembly including a graphene-coated heat spreader according to some implementations.

For further explanation, FIG. 3 sets forth a flow chart illustrating an example method for manufacturing an integrated circuit device assembly including a graphene-coated heat spreader according to implementations of the present disclosure. The method of FIG. 3 includes coupling 302 a die 102 to a substrate 104. The die 102 is a block of semiconducting material such as silicon onto which a functional integrated circuit is fabricated. As an example, the die 102 includes a processor such as a Central Processing Unit (GPU), a Graphics Processing Unit (GPU), or other processor as can be appreciated. The substrate 104 is a portion of material that mechanically supports coupled components such as the die 102. In some implementations, the substrate 104 also electrically couples various components mounted to the substrate 104 via conductive traces, tracks, pads, and the like. As an example, in some implementations, the substrate 104 includes a printed circuit board (PCB). In other implementations, substrate 104 may be another semiconductor device. In these implementations, the semiconductor substrate 104 may include only passive circuitry or may include some active circuitry or, in some implementations, may be another semiconductor integrated circuit die. In some implementations, the die 102 is coupled to the substrate 104 via a socket (not shown), whereby the die 102 is soldered to or otherwise mounted in the socket. In other implementations, the die 102 is directly coupled to the substrate 104 via a direct solder connection or other connection as can be appreciated. In some implementations, the die 102 is coupled to the substrate 104 using a land grid array (LGA), pin grid array (PGA), or other packaging technology as can be appreciated.

The method of FIG. 3 also includes thermally coupling 304 the die 102 to a heat spreader 106a,b (e.g., a heat spreader 106a of FIG. 1A, a heat spreader 106b of FIG. 1B), the heat spreader 106a,b including: a body 108a,b of thermally conductive metal defining a cavity 112 for the die 102 and a graphene layer 110a,b contacting a surface of the body 108a,b. In some implementations, the thermally conductive metal includes copper, nickel, or another thermally conductive metal as can be appreciated. In some implementations, an inner surface of the body 108a,b defines the cavity that receives the die 102 when the heat spreader 106a,b, is thermally coupled to the die 102. In some implementations, the heat spreader 106a,b at least partially surrounds the die 102 after thermal coupling. For example, the heat spreader 106a,b and the substrate 104 (or another component coupled to the substrate 104 such as a socket) house the die 102.

In some implementations, the graphene layer 110a,b includes a chemical vapor deposition of graphene. In some implementations, the graphene layer 110a,b includes a film or other portion of graphene formed separate from the body 108a,b and then adhered to the body 108a,b. In some implementations, the surface of the body 108a,b to which the graphene layer 110a,b contacts is the inner surface of the body 108a,b defining the cavity (e.g., as with a graphene layer 110a of FIG. 1A). Thus, during operation of a device including the die 102, heat is transferred from the die 102 to the graphene layer 110a and distributed throughout the graphene layer 110a. The distributed heat in the graphene layer 110a then transfers to the body 108a. In other implementations, the surface of the body 108a,b to which the graphene layer 110a,b contacts is the outer surface of the body 108a,b opposite the cavity (e.g., as with a graphene layer 110b of FIG. 1B). Thus, during operation of a device including the die, heat is transferred from the die 102 to the body 108b. The heat in the body 108b then transfers to the graphene layer 110b where it is distributed throughout the graphene layer 110b by virtue of graphene's enhanced thermal conductivity and distribution compared to the conductive metal of the body 108b.

In some implementations, the die 102 is thermally coupled to the heat spreader 106a,b via a portion of thermal interface material 114. The thermal interface material 114 is thermally conductive material that improves therernal coupling between two thermally coupled components (e.g., the die 102 and the heat spreader 106a,b). The thermal interface material includes, for example, thermal paste, thermal adhesive, thermal pads, and the like. In some implementations, the thermal interface material 114 thermally couples the die 102 to a body 108b of a heat spreader 106b. In some implementations, the thermal interface material 114 thermally couples the die 102 to a graphene layer 110b applied to an inner surface of a heat spreader 106b.

Figure 4:
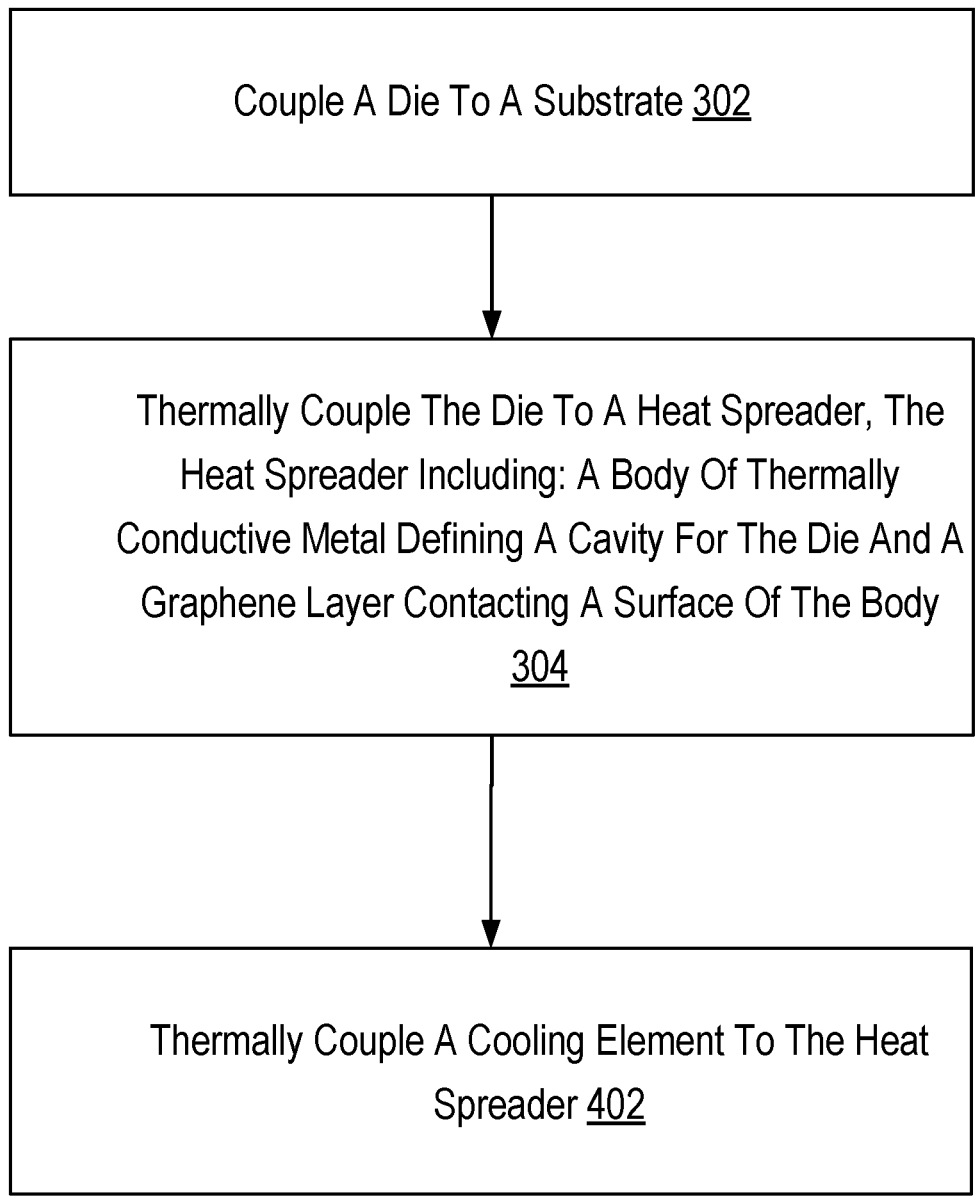
FIG. 4 is a flowchart of an example method for manufacturing an integrated circuit device assembly including a graphene-coated heat spreader according to some implementations.

For further explanation, FIG. 4 sets forth a flow chart illustrating an example method for manufacturing an integrated circuit device assembly including a graphene-coated heat spreader according to implementations of the present disclosure. The method of FIG. 4 is similar to FIG. 3 in that the method of FIG. 4 includes coupling 302 a die 102 to a substrate 104; and thermally coupling 304 the die 102 to a heat spreader 106a,b (e.g., a heat spreader 106a of FIG. 1A, a heat spreader 106b of FIG. 1B), the heat spreader 106a,b including: a body 108a,b of thermally conductive metal defining a cavity 112 for the die 102 and a graphene layer 110a,b contacting a surface of the body 108a,b.

FIG. 4 differs from FIG. 3 in that the method of FIG. 4 also includes thermally coupling 402 a cooling element 202 to the heat spreader 106a,b. The cooling element 202 is a device or component that receives and removes heat generated by the die 102 (e.g., via the heat spreader 106a,b). For example, in some implementations, the cooling element 202 includes a fan, fins, portions of liquid cooling systems, or other cooling elements 202 as can be appreciated. In some implementations, the cooling element 202 is thermally coupled to the heat spreader 106a,b, by virtue of coupling to the thermally conductive metal of a body 108a. In some implementations, the cooling element 202 is thermally coupled to the heat spreader 106a,b by virtue of coupling to a graphene layer 110b on the outer surface of a body 108b.

In view of the explanations set forth above, readers will recognize that the benefits of a graphene-coated heat spreader for integrated circuit device assemblies include:

Improved performance of a computing system by improved heat transfer and distribution of a heat spreader through the use of a graphene layer.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A device comprising:
   a substrate;
   a die coupled to the substrate; and
   a heat spreader thermally coupled to the die, the heat spreader comprising:
      a body of thermally conductive material defining a cavity at least partially surrounding the die; and
      a graphene layer contacting a surface of the body.

2. The device of claim 1, wherein the die is thermally coupled to the heat spreader via a portion of thermal interface material.

3. The device of claim 2, wherein the cavity is defined by an inner surface of the body.

4. The device of claim 3, wherein the graphene layer contacts the inner surface.

5. The device of claim 1, wherein the graphene layer is applied to an outer surface of the body opposite the cavity.

6. The device of claim 1, wherein the graphene layer comprises a graphene film adhered to the surface.

7. The device of claim 1, wherein the graphene layer comprises chemical vapor deposition (CVD) graphene.

8. The device of claim 1, further comprising a cooling element thermally coupled to the heat spreader.

9. The device of claim 1, wherein the substrate comprises a semiconductor material.

10. The device of claim 9, wherein the semiconductor material comprises an integrated circuit.

11. The device of claim 1, wherein the device comprises a computing device.

12. The device of claim 11, wherein the computing device comprises a screen and a housing, whereby the heat spreader reduces localized housing temperatures.

13. A method, comprising:
coupling a die to a substrate; and
thermally coupling the die to a heat spreader, the heat spreader comprising:
a body of thermally conductive metal defining a cavity receiving the die; and
a graphene layer contacting a surface of the body.

14. The method of claim 13, wherein the graphene layer comprises a graphene film adhered to the surface.

15. The method of claim 13, wherein the graphene layer comprises a chemical vapor deposition (CVD) of graphene.

16. The method of claim 13, wherein the heat spreader is thermally coupled to the die by a portion of thermal interface material.

17. The method of claim 13, wherein the graphene layer is applied to an inner surface of the body defining the cavity.

18. The method of claim 13, wherein the graphene layer is applied to an outer surface of the body opposite the cavity.

19. The method of claim 13, further comprising thermally coupling a cooling element to the heat spreader.

20. A heat spreader for integrated circuit dies comprising:
a body of thermally conductive metal defining a cavity configured to receive a die; and
a graphene layer applied to a surface of the body.

21. The heat spreader of claim 20, wherein the graphene layer is applied to an inner surface of the body defining the cavity.

22. The heat spreader of claim 20, wherein the graphene layer is applied to an outer surface of the body opposite the cavity.

23. The heat spreader of claim 20, wherein the graphene layer comprises a graphene film adhered to the surface.

24. The heat spreader of claim 20, wherein the graphene layer comprises chemical vapor deposition (CVD) graphene.

* * * * *